United States Patent
Shi et al.

(10) Patent No.: US 12,285,819 B2
(45) Date of Patent: Apr. 29, 2025

(54) METHOD FOR CUTTING SUBSTRATE WAFER FROM INDIUM PHOSPHIDE CRYSTAL BAR

(71) Applicant: THE 13TH RESEARCH INSTITUTE OF CHINA ELECTRONICS TECHNOLOGY GROUP CORPORATION, Hebei (CN)

(72) Inventors: Yanlei Shi, Hebei (CN); Niefeng Sun, Hebei (CN); Shujie Wang, Hebei (CN); Hongfei Zhao, Hebei (CN); Yaqi Li, Hebei (CN); Lijie Fu, Hebei (CN); Yang Wang, Hebei (CN); Xiaolan Li, Hebei (CN); Huimin Shao, Hebei (CN); Huisheng Liu, Hebei (CN); Jian Jiang, Hebei (CN)

(73) Assignee: THE 13TH RESEARCH INSTITUTE OF CHINA ELECTRONICS TECHNOLOGY GROUP CORPORATION, Shijiazhuang (CN)

(*) Notice: Subject to any disclaimer, the term of this patent is extended or adjusted under 35 U.S.C. 154(b) by 643 days.

(21) Appl. No.: 17/415,928

(22) PCT Filed: Sep. 10, 2020

(86) PCT No.: PCT/CN2020/114329
§ 371 (c)(1),
(2) Date: Jun. 18, 2021

(87) PCT Pub. No.: WO2021/088509
PCT Pub. Date: May 14, 2021

(65) Prior Publication Data
US 2022/0072660 A1    Mar. 10, 2022

(30) Foreign Application Priority Data
Nov. 5, 2019  (CN) .......................... 201911070369.9

(51) Int. Cl.
*B23K 26/362*    (2014.01)
*B23K 26/402*    (2014.01)
(Continued)

(52) U.S. Cl.
CPC .......... *B23K 26/362* (2013.01); *B23K 26/402* (2013.01); *B23K 37/0408* (2013.01);
(Continued)

(58) Field of Classification Search
CPC ................ B23K 26/362; B23K 26/402; B23K 37/0408; B23K 2101/40; B23K 2103/56;
(Continued)

(56) References Cited

U.S. PATENT DOCUMENTS

| 5,484,326 | A |   | 1/1996 | Hirano et al. |
| 5,875,769 | A | * | 3/1999 | Toyama ................. B28D 5/045 |
|           |   |   |        | 125/16.02 |

(Continued)

FOREIGN PATENT DOCUMENTS

| CN | 106863628 B | 8/2018 |
| CN | 109760221 A | 5/2019 |

(Continued)

OTHER PUBLICATIONS

International Search Report and Written Opinion mailed Nov. 30, 2020 in PCT/CN2020/114329.
Office Action mailed Feb. 19, 2021 in CN 201911070369.9.

*Primary Examiner* — Robert G Bachner
(74) *Attorney, Agent, or Firm* — Enable IP, P.C.

(57) ABSTRACT

The invention discloses a method for cutting a substrate wafer from an indium phosphide crystal, and belongs to the field of semiconductor substrate preparation, comprises the following steps of: 1) orientating, cutting the head and the tail of a crystal bar, adjusting the orientation and trying to cut the crystal bar until a wafer with a required crystal orien-
(Continued)

tation cut, wherein the cutting end face is an orientation end face; 2) multi-wire cutting, on a multi-wire cutting apparatus, dividing a crystal bar parallel to an orientation end face into wafers; 3) cleaning, cleaning the wafer until no residue and no dirt existing on the surface; 4) circle cutting, performing circle cutting on the wafer to cut the desired crystal orientation area. According to the technical scheme, for the indium phosphide crystal bar which is difficult to control in diameter and easy to twinning/poly in the growth process, a barreling process which may grind and remove a large amount of InP materials is abandoned, the crystal bar is multi-wire cut into a wafer, and then the substrate wafer which is available in the crystal direction close to the standard size is cut from the wafer to the maximum extent, so that the wafer output can be greatly increased, and the material loss and the waste can be reduced.

10 Claims, 5 Drawing Sheets

(51) Int. Cl.
   *B23K 37/04* (2006.01)
   *B28D 5/00* (2006.01)
   *B28D 5/04* (2006.01)
   *H01L 21/02* (2006.01)

(52) U.S. Cl.
   CPC ........... *B28D 5/0082* (2013.01); *B28D 5/045* (2013.01); *H01L 21/02035* (2013.01)

(58) Field of Classification Search
   CPC ...... B23K 26/36; B28D 5/0082; B28D 5/045; B28D 5/00; B28D 5/0058; B28D 5/04; H01L 21/02035; H01L 21/02005; Y02P 80/30
   See application file for complete search history.

(56) References Cited

U.S. PATENT DOCUMENTS

| | | | | |
|---|---|---|---|---|
| 6,109,253 | A * | 8/2000 | Ikehara | B23D 57/0053 125/16.02 |
| 2001/0051683 | A1* | 12/2001 | Honma | B28D 5/0082 524/425 |
| 2002/0100750 | A1* | 8/2002 | Shi | G05B 19/4099 219/121.72 |
| 2017/0237220 | A1* | 8/2017 | McGanty | H01S 3/0632 359/337.3 |
| 2022/0072660 | A1* | 3/2022 | Shi | B28D 5/045 |

FOREIGN PATENT DOCUMENTS

| | | |
|---|---|---|
| CN | 110328766 A | 10/2019 |
| CN | 110341060 A | 10/2019 |
| CN | 111152375 A | 5/2020 |
| JP | 3144269 B2 | 3/2001 |
| JP | 2012232358 A | 11/2012 |

* cited by examiner

METHOD FOR CUTTING SUBSTRATE WAFER FROM INDIUM PHOSPHIDE CRYSTAL BAR

TECHNICAL FIELD

The invention belongs to the technical field of metallurgy, relates to preparation of an indium phosphide wafer, and particularly relates to a method for cutting an indium phosphide crystal into a substrate wafer.

BACKGROUND ART

InP is a III-V semiconductor material, which is widely used in the fields of high-frequency electronic devices (such as HEMT, HBT, etc.), 5G communication, optical fiber communication and radiation-resistant solar cells because of its excellent transport characteristics, high mobility, special photoelectric properties and excellent radiation resistance. However, at present, the price of InP single crystal substrate material remains high, and its wide application is limited by the price. The main reason for the high price of InP single crystal substrate material is the low yield of InP single crystal growth. Twinning is the biggest factor affecting the yield of InP single crystal. InP has the lowest stacking fault energy in III-V semiconductor materials, and easily generates atom stacking fault on the <111> plane in the growth process, thereby generating twinning and poly crystal Twinning and poly crystal tend to be interpenetrating and follow a certain tilt angle, as shown in FIG. 1. The InP crystalline semiconductor crystal bar has an internally chopped twinning line. Most of the twinning crystal in group III-V semiconductors are rotation twinning crystal, i.e. the twinning crystal are rotated 180 degrees along the normal axis of the {111} plane. The positive crystal orientation portion 1 of the <100> crystal orientation and the rotational crystal orientation portion 2 of the <221> crystal orientation are indicated. Wafers are taken at the upper 3 and middle 4 positions, and processed wafers are shown as 5 and 6. <221> The rotational crystal orientation portion 2 of the crystal orientation is not available in the following process; wafers containing a small number of twinning/poly crystal (typically 5%-20% twinning/poly area), such as degraded wafer 6 as shown, can be downgraded for low-grade product use, wafers containing more twinning/poly area, such as scrap wafer 5 as shown, can only be scrapped. The main growth methods of InP single crystal are LEC method, VGF method and VB method. In the VGF and VB methods, when the crystal grows, the crystal is attached to the wall of the crucible, and the growing diameter is consistent with the size of the inner wall of the crucible, so that the size of the crystal is controlled by designing and determining the size of the inner wall of the crucible, and the shape of a crystal bar is regular, as shown in FIG. 1. In LEC growth method, the InP single crystal is not in contact with the crucible wall, and the diameter of the crystal is affected by the complex factors such as the pulling speed, the heat dissipation and the system cooling speed. Crystal bars tend to exhibit non-uniform diameters, and sometimes multiple shrinking/growing processes may occur, as shown in FIG. 2. In FIG. 2, 7 represents the seed crystal and 8 represents the crystal bar.

Currently, the major specifications for InP single crystal substrate products are 2 inches, 3 inches and 4 inches, with wafers of crystal orientation <100> predominating. A conventional method for processing a <100> crystal orientation wafer from a <100> crystal orientation crystal bar is as follows: cutting head and tail for orientation→barreling→multi-wire cutting→obtaining wafers of corresponding specifications. As shown in FIG. 3, the InP crystal bar 8 is grown by seeding a <100> crystal orientation seed crystal 7, the crystal bar diameter is not uniform, and due to twinning, the crystal bar 8 has a positive crystal orientation portion 1 and a rotational crystal orientation portion 2. The crystal is oriented through head and tail cutting to obtain an oriented crystal 9, then is subjected to barreling to obtain a 3-inch crystal bar 10, and is subjected to multi-wire cutting to obtain three types of wafers, namely a 3-inch positive crystal orientation wafer 11, a 3-inch degraded wafer 6 and a scrap wafer 5. A small number of crystal bars with larger diameters can be continuously barreled to obtain small-sized wafers. According to the method for processing the wafer, a large number of materials can be ground and removed by the barreling process, the material loss is large, and the wafer output is small.

SUMMARY OF THE INVENTION

In order to solve the problems of large material loss and small wafer output amount in the conventional wafer manufacturing process, a crystal bar is firstly subjected to multi-wire cutting to manufacture a wafer, then the wafer is subjected to maximum circle cutting and produce wafer, and the wafer output amount can be obviously improved.

The technical scheme of the invention is as follows: a method for cutting a substrate crystal wafer from an indium phosphide crystal comprises the following steps of:

1) orientating: cutting the head and the tail of a crystal bar, adjusting the orientation and trying to cut the crystal bar until a wafer with a required crystal orientation cut, wherein the cutting end face is an orientation end face;
2) multi-wire cutting: on a multi-wire cutting apparatus, dividing a crystal bar parallel to an orientation end face into wafers;
3) cleaning: cleaning the wafer until no residue and no dirt existing on the surface;
4) circle cutting: performing circle cutting on the wafer to cut the desired crystal orientation area.

According to the technical scheme, for the indium phosphide crystal bar which is difficult to control in diameter and easy to twinning/poly in the growth process, a barreling process which may grind and remove a large amount of InP materials is abandoned, the crystal bar is multi-wire cut into a wafer, and then the substrate wafer which is available in the crystal direction close to the standard size is cut from the wafer to the maximum extent, so that the wafer output can be greatly increased, and the material loss and the waste can be reduced. Further, in the step 1), the parallelism error of the orientation end face and the required crystal orientation is +/−0.02°. The commonly used indium phosphide substrate wafer is a <100> crystal orientation, in order to efficiently and accurately cut the required <100> crystal orientation wafer, trial cutting and measurement are needed before cutting to find out the <100> crystal plane of the indium phosphide single crystal, and then the found <100> crystal plane is used as an orientation end face to divide the wafer. The orientation step is determined by means of a three-dimensional sample stage and an X-ray director, and generally requires a crystal orientation deviation of <0.05°. In order to ensure cutting accuracy, the end face orientation accuracy is preferably ±0.02°.

Furthermore, in order to accurately cut the wafer with the required crystal orientation, in the step 2), the cutting steel wire is parallel to the orientation end face of the crystal bar. After the crystal bar is oriented, the orientation end face of the crystal bar is the crystal face with the required crystal orientation, the orientation end face of the crystal bar are cut in parallel with the cutting steel wire, so that a wafer with the required crystal orientation can be cut out, the more accurate the orientation is, the higher the parallelism is, and the higher the cutting accuracy is.

Furthermore, in order to support and orient the crystal bar conveniently, reduce the processing damage efficiency of the wafer, improve the efficiency and reduce the cost, in the steps 1) and 2), the crystal bar is bonded to the carrier plate, and the carrier plate is provided with a placing groove matched with the shape of the side edge of the crystal bar. The Moh's hardness of the indium phosphide material is only about 5, and the material is very brittle and easy to damage. In the process of crystal cutting, chipping and edge breaking often occur, the breakage rate is about 5%, especially for crystal bars with non-uniform diameters, the breakage rate is higher, the processing yield is seriously affected, and the cost is increased. The carrier plate adapts to the shape design of the side edge of the crystal bar, forms a semi-enclosed support for the crystal bar, increases the support area, ensures that the cutting process is stable and does not shake, and the support force of a single wafer after cutting is large, so that the breakage of the wafer caused by wafer adhesion, inclination and shaking can be avoided, and the breakage rate is reduced to below 0.5%.

Furthermore, in order to facilitate processing and manufacturing, effectively support and protect the crystal bar and the wafer, the carrier plate is a graphite plate or a resin plate which is close to the hardness of the indium phosphide crystal.

Further, in order to facilitate circle cutting, the wafer thickness divided in the step 2) is less than or equal to 2000 m. The wafer thickness is too large, the efficiency is low during circle cutting, the fragmentation rate is high, and the notch is rough. When the laser is used for circle cutting, the range of the focal depth required by the laser becomes larger along with the increase of the thickness, the wafer with the large thickness is cut by the laser with the shallow focal depth, the focusing difficulty is large, the laser capability is easy to disperse, the cutting efficiency is low, the heat affected zone is too large, the chip rate is high, and the notch is rough; if equipped with multifocal, long focal depth apparatus, it results in high production costs. On the basis of satisfying the substrate wafer thickness requirement, the wafer thickness is preferably 2000 µm or less.

Further, in the step 4), the circle cutting is performed by a laser having a wavelength of 532 nm, a power of 50-200 W, and a cutting rate of 10-50 mm/s. The thermal effect of laser circle cutting will lead to uneven local heating, break the wafer, scorch the edge of the wafer, and produce burrs. The shorter the wavelength, the smaller the heat-affected zone, but the lower the cutting ability. In addition, the InP material is transparent to infrared light waves, and infrared waves with the wavelength of 1064 nm commonly used in metal cutting are not suitable for cutting InP materials, preferably 532 nm green laser obtained through frequency multiplication or ultraviolet laser with shorter wavelength. In order to balance the thermal influence and the cutting ability, the laser with the wavelength of 510-550 nm is selected, the power is controlled to be 50-200 W, and the cutting speed is controlled to be 10-50 mm/s, which can effectively reduce the chip rate, and ensure the cutting quality on the basis of ensuring the cutting efficiency. When cutting wafers of 1000 µm with 30 µm in each removal, the complete cutting time of 2-inch wafers is 1.5-3 min, that of 3-inch wafers is 2.5-4.5 min, that of 4-inch wafers is 4-6 min, and the breakage rate is less than 0.3%, the edge of the wafer is smooth, neat, no scorch and no burr.

Further, in the step 4), each removal amount of the laser cutting is 10-50 µm. The removal amount of each cutting cannot be too large, if too large, chips can be caused by local stress, or melted residues cannot be discharged in time and can be settled at the notch, so that the chips and notch roughness and the cutting efficiency are influenced. During the specific cutting, the corresponding removal amount is selected according to the thickness of the wafer, and the set pattern is repeatedly cut until the wafer is completely cut.

Further, in the step 4), pumping and deslagging are performed in the laser cutting process. The traditional compressed gas blowing is easy to blow the wafer into embrittlement, the adhesion force after the indium phosphide material melting is lower than that of metal, a pumping system is arranged, collection of cutting residues, gas and the like is facilitated, clean cut side walls can be obtained during laser scanning, cutting quality and efficiency can be avoided, and wafer quality can be improved.

Further, the type of the cleaning agent in the step 3) is matched with the type of the multi-wire cutting cutting fluid. The cleaning agent is selected according to the type of cutting fluid used for multi-wire cutting, water is used for cleaning if the water-based cutting fluid is selected, and kerosene, alcohol and other organic solvents are selected for cleaning the wafer if the oil-based cutting fluid is selected.

The invention has the beneficial effects that: 1. The wafer cutting method in the invention is applied to wafer processing with large diameter control difficulty and easy twinning/poly crystal in the growth process, the wafer output can be greatly improved, and the cut wafer value of the same crystal bar is improved by more than 50%. 2. The method is simple and easy to use, high in cutting accuracy, high in efficiency, low in breakage rate and high in yield rate, and is suitable for cutting various crystal bars. 3. Laser circle cutting enables the wafer to generate cracks from the top to the bottom through laser, external force does not need to be applied to separate the wafer, and the process flow is simple; scrap generation can be avoided, block leftover materials can be used as materials for remelt, and processing loss is small.

Figure 1:
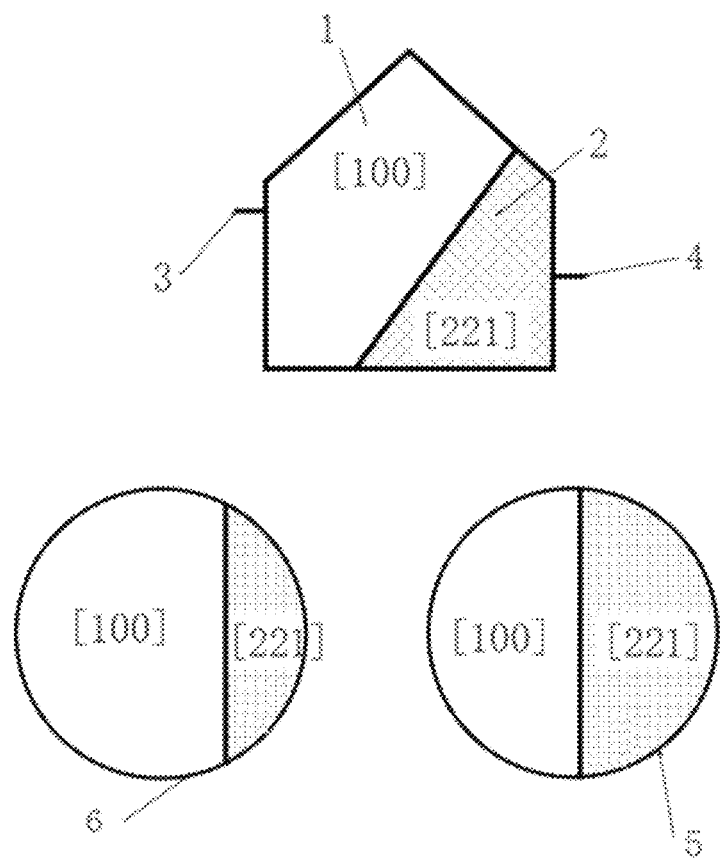
FIG. 1 is a schematic view showing the structure of a crystal bar and twinning of a cut wafer.
Figure 2:
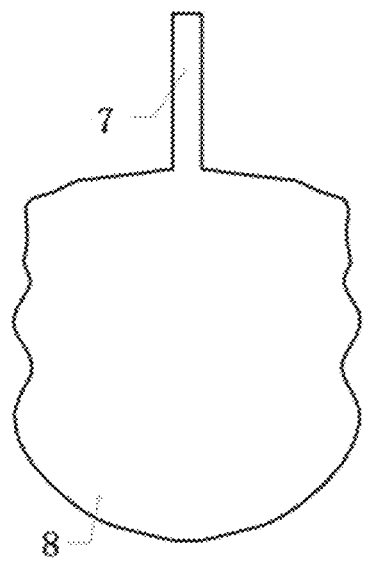
FIG. 2 is a schematic diagram of the structure of a crystal bar.
Figure 3:
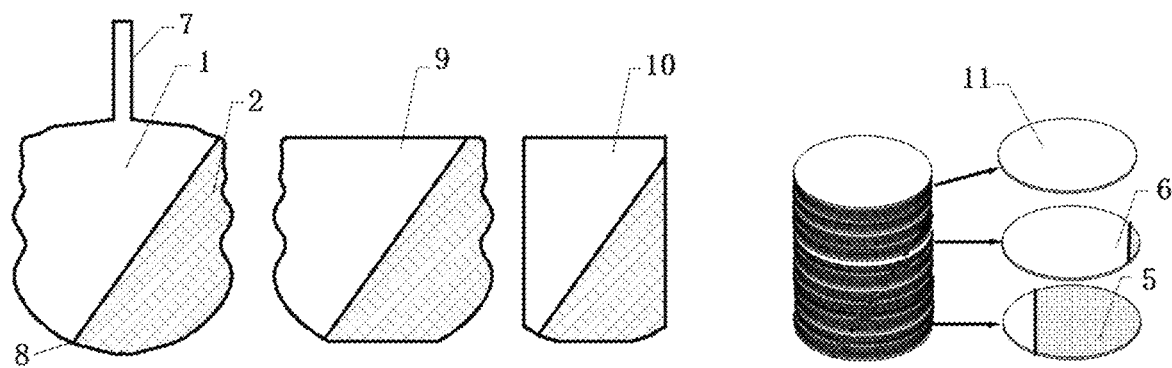
FIG. 3 is a schematic flow diagram of a conventional barreling process for substrate wafer.

In the drawings, 1 represents a positive crystal orientation portion, 2 represents a rotational crystal orientation portion, 3 represents an upper portion, 4 represents a middle portion, 5 represents a scrap wafer, 6 represents a degraded wafer, 7 represents a seed crystal, 8 represents a crystal bar, 9 represents an oriented crystal, 10 represents a 3-inch crystal bar, 11 represents a positive crystal orientation wafer, 12 represents a carrier plate, 13 represents a 2-inch wafer, and 14 represents a positive crystal orientation wafer area, 15 represents a 3-inch degraded wafer area and 16 represents a 2-inch wafer area. Dimensions are given in millimeters.

DETAILED DESCRIPTION OF THE INVENTION

The present invention will now be described in detail with reference to the accompanying drawings and embodiments.

Figure 4:
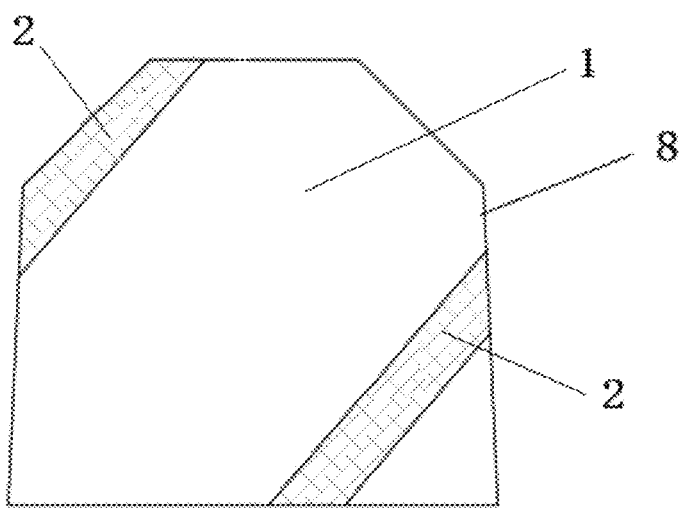
FIG. 4 is a schematic view showing a crystal orientation structure of a crystal bar in an embodiment.
Figure 5:
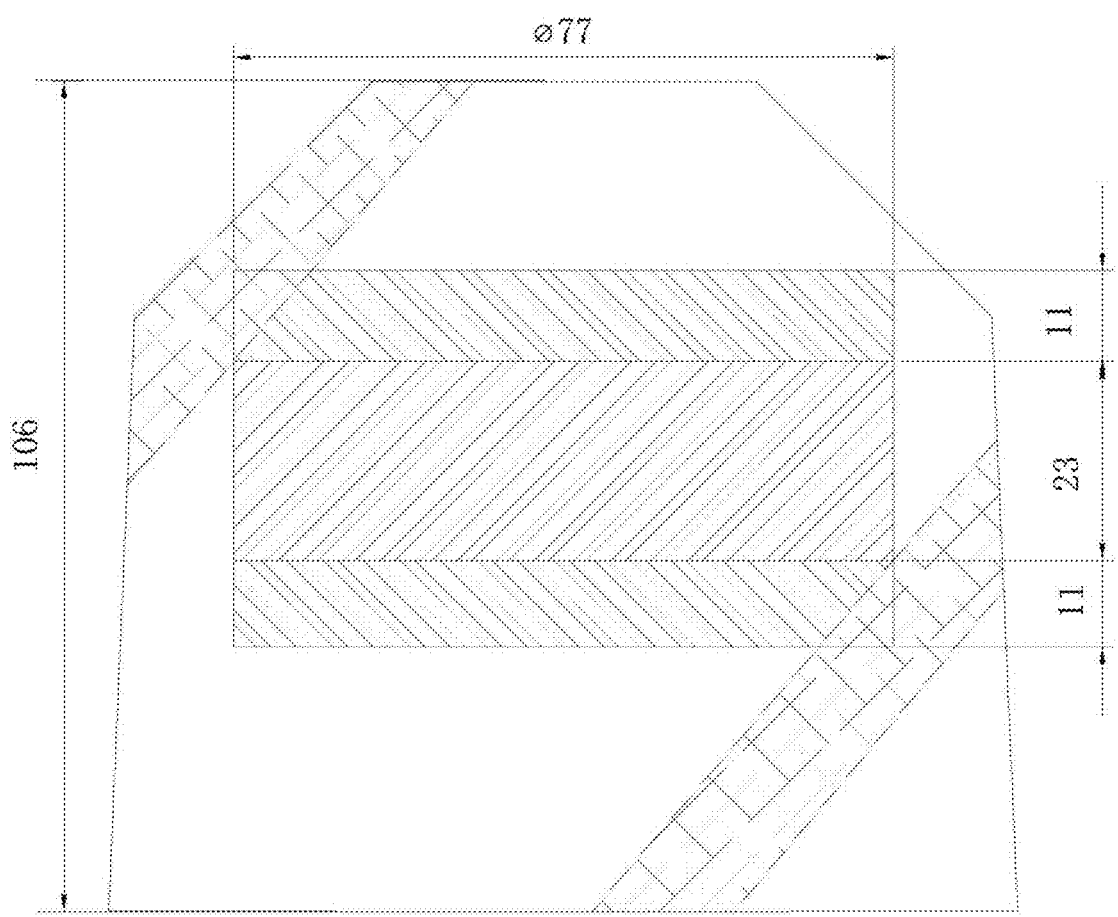
FIG. 5 is a schematic view of a usable area for conventional barreling processing of a wafer in an embodiment.

In the present embodiment, as shown in FIG. 4, the indium phosphide crystal bar 8 has an internally chopped twinning line and has a non-uniform diameter. The <100> crystal orientation wafer needs to be processed as an InP substrate product. A desired substrate wafer has a thickness of 1 mm and a diameter of 3 inches, and a non <100> crystal orientation portion within 10 mm from the wafer edge is a degraded wafer. Due to the specificity of crystal growth, the probability of growing the same crystal bar is extremely low, and according to the process in the prior art, cutting head and tail for orientation→barreling→multi-wire cutting→obtaining wafers of corresponding specifications, see FIG. 5, a substrate wafer with a thickness of 1 mm is cut, the shaded portion is an available area of the crystal bar, and according to theoretical and empirical calculations, a positive crystal orientation wafer area 14 can be cut into a 3-inch positive crystal orientation wafer 23; the 3-inch degraded wafer area 15 may be cut into a 3-inch degraded wafers 22.

Figure 6:
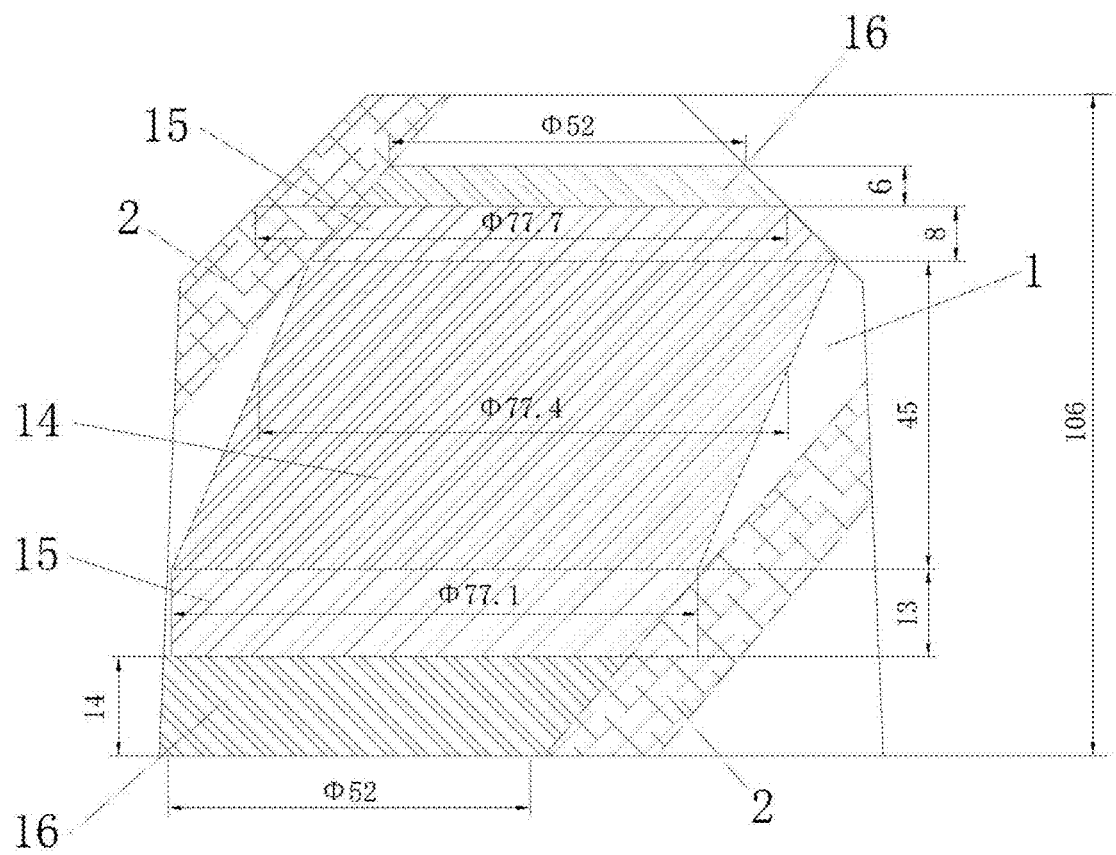
FIG. 6 is a schematic view of a usable area for processing a wafer of the present invention in an embodiment.

The crystal bar is processed into a substrate wafer in accordance with the method of the present invention, see FIG. 6, the shaded portion is the available area of the crystal bar. Theoretically, the positive crystal orientation wafer area 14 can be cut into a 3-inch positive crystal orientation wafer with yield of 45 wafers; 3-inch degraded wafer area 15 can be cut into a 3-inch degraded wafer with yield of 21 wafers, and a 2-inch wafer area 16 can be cut into a 2-inch positive crystal orientation wafer with yield of 20 wafers. A 2-inch InP wafer with twinning or poly crystal is less valuable and is not calculated. 3-inch positive crystal orientation wafer has a value calculated at a market average price of 3000 yuan, and the 3-inch degraded wafer has a value of 70% of the positive crystal orientation wafer value, i.e., 2100 yuan, 2-inch positive crystal orientation wafer has a value of 1200 yuan. See Table 1 for comparison of wafer yield and value for both methods.

| Processing method | 3-inch positive crystal orientation wafer amount | 3-inch degraded wafer amount | 2-inch positive crystal orientation wafer | Total wafer value | Wafer total value improvement ratio |
|---|---|---|---|---|---|
| Conventional barreling method | 23 | 22 | 0 | 115200 | 76.3% |
| Method of the present invention | 45 | 21 | 20 | 203100 | |

Figure 7:
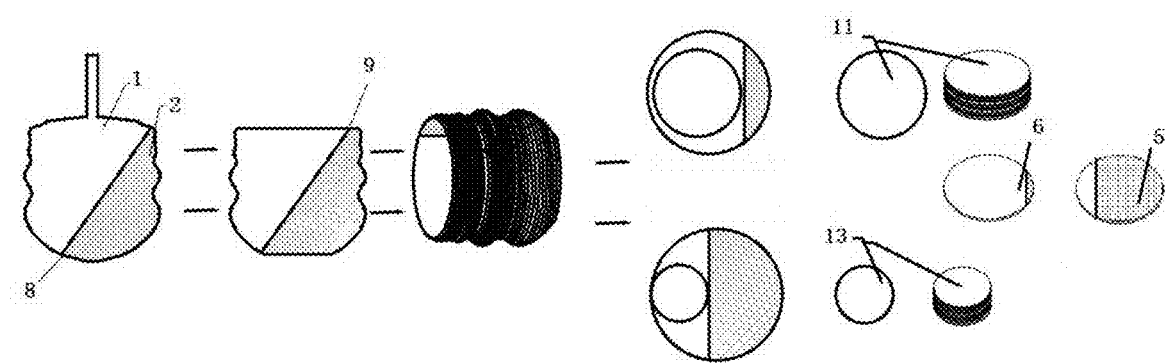
FIG. 7 is a schematic flow chart for processing a substrate wafer according to the present invention.
Figure 8:
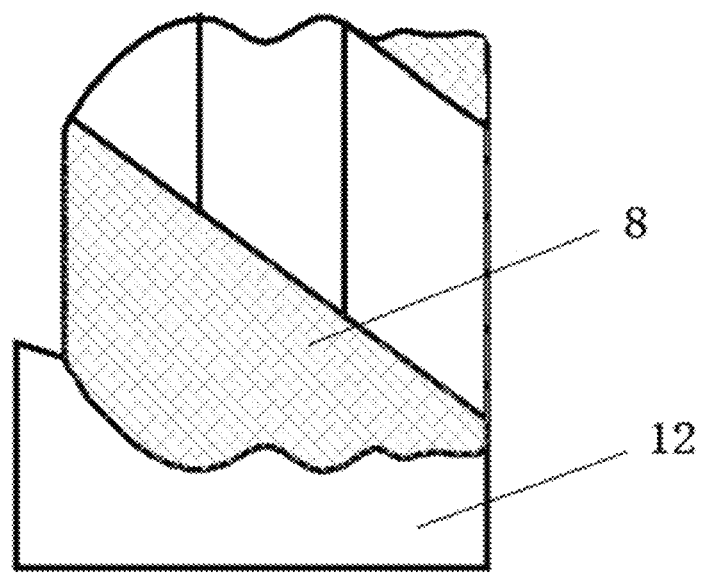
FIG. 8 is a schematic view showing the structure of a carrier plate supporting a crystal bar in an embodiment.

Processing the crystal bar into a substrate wafer according to the process shown in FIG. 7, the specific steps are as follows:
1) orientation: as shown in FIG. 8, the crystal bars are longitudinally bonded on a graphite carrier plate 12, the carrier plate 12 is fixed on a three-dimensional sample table of a cutting machine, and the end surfaces of the crystal bars 8 serve as reference surfaces. A sample is cut from the head of the crystal bar 8, the surface crystal orientation of the cutting surface is tested by an X-ray director, the deviation angle of the cutting surface from the <100> ideal crystal plane is calculated, the orientation of the crystal bar 8 is adjusted according to the deviation angle value, and the cyclic operation is performed until the crystal orientation of the cut end face meets the requirement, and the orientation precision of the end surface is ±0.02°. The tail cutting orientation step of the crystal bar 8 is consistent with the head, and an oriented crystal 9 is obtained. The cutting machine used PLN-27 type internal circle cutting machine produced by Tokyo Seimitsu Co. Ltd., and X-ray orientation instrument used YX-3 type produced by Liaodong Radioactive Instrument Co. Ltd.
2) multi-wire cutting: the oriented crystal 9 and the carrier plate 12 are clamped on a workbench of the multi-wire cutting apparatus, the parallelism of a cutting steel wire and an orientation end face is detected, and the orientation of the workbench is adjusted, so that the parallelism error is less than 0.02°. Setting cutting parameters: the wire speed is 250 m/min, the wire tension is 22 N, the wire supply speed is 30 m/min, and the cutting speed is 0.6 mm/min, the crystal bar 8 is cut into wafers with a thickness of 1 mm. The wire saw adopts a U-600 type manufactured by Yasunage Corporation Japan.
3) cleaning: cleaning the wafer with water until no residue and no dirt exist on the surface.
4) circle cutting: determining the circle cutting position of each piece according to the area of the positive crystal direction in combination with the required 3-inch specification; A laser with a wavelength of 532 nm is used, a laser power of 70 W is selected, a cutting rate of 30 mm/s is selected, a removal amount per time is 30 m, a set cutting pattern is repeatedly cut, cutting completely for 3 min, and the wafer is taken out. In the cutting process, cutting residues, gas and the like are collected by using a suction system. As shown in FIG. 7, a 3-inch positive crystal orientation wafer 11, a 3-inch degraded wafer 6 are cut, with some a 3-inch wafer cannot be cut from, but a 2-inch wafer 13 can be cut. The scrap wafers 5 and the processed bulk scrap can be used as a material for remelt.

In this embodiment, a 3-inch positive crystal orientation wafer 44, a 3-inch degraded wafer 19, a 2-inch positive crystal orientation wafer 20, and a 2-inch InP wafer with twinning or poly crystal are less valuable and not calculated. The edge of the wafer is smooth, neat, non-focal, burr-free, and the crystal orientation of the crystal plane is accurate. The 3-inch positive crystal orientation wafer is 1 piece less than the theoretical value, and the 3-inch degraded wafer is 2 pieces less than the theoretical value, compared with the pre-cut wafers calculated by the existing barreling method, the total value of the pre-cut wafers was increased by 70.1%.

The invention claimed is:

1. A method for cutting a substrate crystal wafer from an indium phosphide crystal characterized by comprising following steps of:
   1) orientating: cutting a head and a tail of a crystal bar, adjusting the orientation and cut the crystal bar until a wafer with a required crystal orientation cut, wherein the cutting end face is an orientation end face;
   2) multi-wire cutting: on a multi-wire cutting apparatus, dividing the crystal bar parallel to an orientation end face into wafers;

3) cleaning: cleaning the wafer until no residue or dirt exists on the surface;

4) circle cutting: performing circle cutting on the wafer to cut an area having a same crystal orientation.

2. The method for cutting a substrate crystal wafer from the indium phosphide crystal of claim 1, characterized in that: in the step 1), the parallelism error of the orientation end face and the required crystal orientation is +/−0.02°.

3. The method for cutting a substrate crystal wafer from the indium phosphide crystal of claim 2, characterized in that: in the step 2), a cutting steel wire is parallel to the orientation end face of the crystal bar.

4. The method for cutting a substrate crystal wafer from the indium phosphide crystal of claim 1, characterized in that: in the steps 1) and 2), the crystal bar is bonded to a carrier plate, and the carrier plate is provided with a placing groove matched with the shape of a side of the crystal bar.

5. The method for cutting a substrate crystal wafer from the indium phosphide crystal of claim 4, characterized in that: the carrier plate is a graphite plate or a resin plate.

6. The method for cutting a substrate crystal wafer from the indium phosphide crystal of claim 1, characterized in that: the wafer thickness divided in the step 2) is less than or equal to 2000 km.

7. The method for cutting a substrate crystal wafer from the indium phosphide crystal of claim 6, characterized in that: in the step 4), the circle cutting is performed by a laser having a wavelength of 510-550 nm, a power of 50-200 W, and a cutting rate of 10-50 mm/s.

8. The method for cutting a substrate crystal wafer from the indium phosphide crystal of claim 7, characterized in that: in the step 4), each removal amount of the laser cutting is 10-50 km.

9. The method for cutting a substrate crystal wafer from the indium phosphide crystal of claim 1, characterized in that: in the step 4), pumping and deslagging are performed in the laser cutting process.

10. The method for cutting a substrate crystal wafer from the indium phosphide crystal of claim 1, characterized in that: a type of the cleaning agent in the step 3) is matched with a type of the multi-wire cutting fluid.

* * * * *